(12) United States Patent
Hong et al.

(10) Patent No.: US 6,614,490 B2
(45) Date of Patent: Sep. 2, 2003

(54) DIGITAL TELEVISION RECEIVER AND TIMING RECOVERING APPARATUS AND METHOD THEREFOR

(75) Inventors: Sung Ryong Hong, Kyonggi-do (KR); Young Mo Gu, Seoul (KR)

(73) Assignee: LG Electronics Inc., Seoul (KR)

( * ) Notice: Subject to any disclaimer, the term of this patent is extended or adjusted under 35 U.S.C. 154(b) by 391 days.

(21) Appl. No.: 09/758,204

(22) Filed: Jan. 12, 2001

(65) Prior Publication Data
US 2001/0007480 A1 Jul. 12, 2001

(30) Foreign Application Priority Data
Jan. 12, 2000 (KR) .......................................... 2000-1415

(51) Int. Cl.[7] ............................ H04N 5/44; H04N 5/455
(52) U.S. Cl. ........................ 348/725; 348/726; 348/735
(58) Field of Search ................................. 348/725, 726, 348/735, 638, 641, 507, 536, 537; 375/326, 327, 270, 321; H04N 5/44, 5/455

(56) References Cited

U.S. PATENT DOCUMENTS 6,356,598 B1 * 3/2002 Wang .......................... 348/725

* cited by examiner

*Primary Examiner*—Sherrie Hsia
(74) *Attorney, Agent, or Firm*—Birch, Stewart, Kolasch & Birch, LLP

(57) ABSTRACT

A digital television (TV) receiver using a vestigial sideband (VSB) system, and timing recovering apparatus and method for the digital TV receiver are disclosed. The timing error can be compensated for by rapidly and accurately searching the position of the segment sync signal using the Hilbert filter even if the strong 2-symbol-delayed ghost is applied. Also, the tracking performance for the timing error and the zitter performance can be improved by extracting the timing error information even from the signal having passed through the Hilbert filter.

20 Claims, 14 Drawing Sheets backgroung art backgroung art backgroung art backgroung art backgroung art

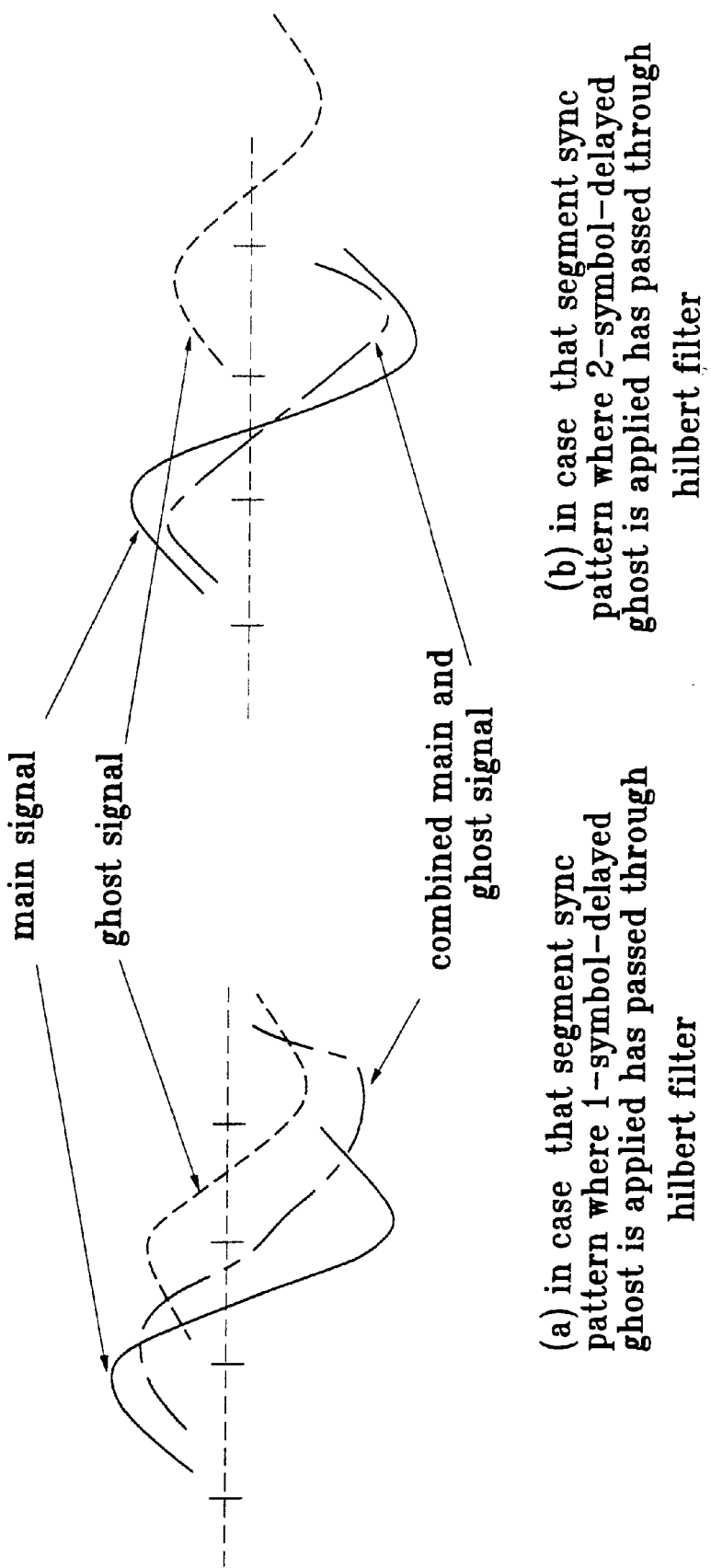

DIGITAL TELEVISION RECEIVER AND TIMING RECOVERING APPARATUS AND METHOD THEREFOR

BACKGROUND OF THE INVENTION

1. Field of the Invention

The present invention relates to a digital television (TV) receiver using a vestigial sideband (VSB) system, and timing recovering apparatus and method for the digital TV receiver.

2. Description of the Related Art

A high definition television (HDTV) is a next-generation digital TV system developed so that a viewer in a living room can feel the impression in a theater as it is. In comparison to a present analog TV, the HDTV has a much better resolution and a wider aspect ratio, and provides a multichannel sound at a level of a compact disc.

In the United States, Europe, and Japan, the standardization of such a digital TV has been expedited by preparing a broadcasting type and standard in their own ways. In the United States, the transmission format adopts the vestigial sideband (VSB) system proposed by Zenith. In a compression format, MPEG is adopted for video compression, and Dolby AC-3 is adopted for audio compression. Also, the display format is prescribed to be compatible with the existing display method.

For digital transmission of video data compressed by the above-described standard, an error correction coding (ECC) is performed on the compressed video data. At this time, in order to facilitate the data recovery at a receiving part, a synchronizing (sync) signal prepared in a prearranged period is inserted between the error-correction-coded data.

The sync signal is briefly classified into two, a data segment sync signal and a field sync signal.

Here, as shown in FIG. 1, one segment is composed of a data segment signal of 4 symbols and data of 828 symbols. One frame is composed of 313 data segments, which are one field sync segment including a training sequence signal, and 312 general data segments.

At a transmission part such as a broadcasting station, a transmitted signal passes through a mapper for changing the power of the signal to a desired power level before it is transmitted. For example, in case of an 8VSB signal for ground broadcasting, the output level of the mapper one among 8-stage symbol values (i.e., amplitude levels) of −168, −120, −72, −24, 24, 72, 120, and 168. Also, according to the prearrangement, the mapper compulsorily prepares and inserts a 4-symbol data segment sync signal among every 828 symbols, and a field sync signal among every 313 data segments. At this time, the prearranged form of the data segment sync signal is 1, −1, −1, and 1 in logic, and the allocated mapper output levels are '120' when the sync signal is '1', and '−120' when the sync signal is '0'. In other words, the data segment sync signal has two levels that continuously alternate for each data segment.

FIG. 2a shows an output form of the segment sync signal in the 8VSB transmission system for ground broadcasting, and FIG. 2b shows the low-pass-filtered waveform of the sync signal. The signal actually received in the receiving part is the low-pass-filtered signal.

In the receiving part such as a TV receiver as shown in FIG. 3, when a VSB-modulated radio frequency (RF) signal is received through an antenna, a tuner 101 selects a frequency of a desired channel by tuning, and converts the selected frequency into a intermediate frequency (IF) signal. A frequency phase locked loop (FPLL) section 102 modulates the IF signal outputted from the tuner 101 to I and Q channel signals of a baseband, and locks their frequencies and phases.

The FPLL section 102 is a circuit where a frequency tracking loop and a PLL are integrated, and serves to lock the frequency first, and then locks the phase if the frequency is locked.

An analog-to-digital (A/D) conversion section 103 converts the I channel signal of the FPLL section 102 into 10-bit digital data, and outputs the digital data to a sync signal detection section 104. Here, the Q channel signal is used only for carrier recovery.

The sync signal detection section 104 detects the data segment sync signal, field sync signal, etc., inserted in the transmitted signal using the 10-bit digital data from the A/D converter 103, and outputs the detected signals to an equalization and error correction section 106. The equalization and error correction section 106 performs an equalization with respect to the data segment sync signal, field sync signal, etc., recovered by the sync signal detection section 104 to correct a linear distortion of amplitude that causes an interference among symbols, and a ghost caused by the signal reflected from a building, mountain, etc., using a training signal, corrects errors produced through a transmission channel, and outputs the equalized and error-corrected signal to a video decoder 107. The video decoder 107 decodes the equalized and error-corrected signal by an MPEG algorithm to form a video signal that a viewer can view.

At this time, an advanced television systems committee (ATSC) VSB transmission system of the United States digital TV (DTV) type carries only data on the transmitted signal.

Accordingly, the receiving part as shown in FIG. 3 should use the same clock signal as used for transmission to recover the data. This function is performed by a timing recovery section 105.

According to the currently proposed ATSC standard, the timing recovery is to be performed using the data segment sync signal regularly inserted by the transmission part.

FIG. 4 is a block diagram of a general timing recovery section 105. Referring to FIG. 4, an analog-to-digital conversion (ADC) section 103 converts the input analog I-channel signal into a digital signal, and outputs the digital signal to a segment sync detection section 104-1 of the sync signal detection section 104 and to a timing error detection section 201 of the timing recovery section 105. The segment sync detection section 104-1 detects a position of the segment sync signal from the digital I-channel signal, and produces a timing enable (timen) signal, PWM enable (pwmen) signal, etc., from the detected segment sync signal. At this time, the timen signal is used as an enable signal of the timing error detection section 201 that extracts timing information, and the pwmen signal is used as an enable signal of a pulse width modulation (PWM) section 202 that converts an output of the timing error detection section 201 so that a converted signal can be used in a charging pump 203.

Here, the timing error detection section 201 can be implemented by a quadrature filter. Specifically, the timing recovery section 105 performs the timing recovery only in a segment sync section after detecting the segment sync signal, and the quadrature filter for extracting the timing information operates in the segment sync section.

The output of the timing error detection section 201 is converted into an up/down signal of the following charging pump 203 by the PWM section 202. The output of the charging pump 203 is inputted to a VCXO 205, after passing through a loop filter 204, to control the VCXO 205. The VCXO 205 adjusts an A/D clock outputted to the ADC 103.

As described above, the timing recovery section 105 recovers the timing to be used as the A/D clock of the A/D conversion section 103 using the data segment sync signal detected by the sync detection section 104.

However, the above-described timing recovery method using the circuit of FIG. 4 shows a very weak characteristic if a strong two-symbol-delayed ghost is added to the original signal and inputted. Specifically, FIG. 5a shows a pattern of the data segment sync signal in case that a one-symbol-delayed ghost exists. In this case, the segment sync pattern is maintained. FIG. 5b show a pattern of the data segment sync signal in case that a two-symbol-delayed ghost exists. In this case, the segment sync pattern is distorted due to the two-symbol-delayed ghost applied thereto, and thus, a correlation value between the distorted pattern and the original segment sync pattern inserted in the transmission part cannot be obtained.

In this case, the segment sync section cannot be recognized, and this causes the enable signal of the timing error detection section 201 for detecting the timing error no to be produced. Accordingly, since the timing error cannot be obtained, it cannot be compensated for. If the timing error is not compensated for, it exerts a fatal effect upon the whole performance of the DTV receiver.

Specifically, if the segment sync detection section 104 cannot accurately detect the data segment sync signal, the timing recovery section 105 cannot accurately recover the timing information. Since this timing information is provided as a clock of the A/D conversion section, the data segment sync signal cannot be accurately detected to cause a vicious circle. Also, since the recovery of the data segment sync signal is performed at a front stage of the receiver, the receiver may not operate at all if the recovery of the data segment sync signal is not accurately performed.

SUMMARY OF THE INVENTION

Accordingly, the present invention is directed to a digital TV receiver and timing recovering apparatus and method for the digital TV receiver that substantially obviate one or more of the problems due to limitations and disadvantages of the related art.

An object of the present invention is to provide a digital TV receiver which can improve the performance of the receiver by preventing the malfunction of timing recovery.

It is another object of the present invention to provide a digital TV receiver and timing recovering apparatus and method for the digital TV receiver which can more stably perform the segment sync signal detection and timing recovery by using not only data inputted through an I channel but also a Q-channel signal through an internal filter for the segment sync signal detection and timing recovery.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the digital television (TV) receiver comprises a filtering section for extracting a Q-channel signal whose phase is inverted by 90° from an input I-channel signal, a segment sync detection section for obtaining a correlation value between the input I-channel signal and a preset segment sync signal form, and a correlation value between the input Q-channel signal and the preset segment sync signal form, and adding and integrating for a predetermined time the two correlation values, the segment sync detection section judging a segment sync section by searching a peak value of integrated values, and outputting a control signal for informing recovery of the segment sync signal, and a timing recovery section for operating in accordance with the control signal provided from the segment sync detection section, and performing a timing recovery by extracting timing error information from the I-channel signal and the Q-channel signal.

Preferably, the filtering section comprises a Hilbert filter for inverting a phase of the input I-channel signal by 90°.

The segment sync detection section comprises a first correlation section for obtaining the correlation value between the input I-channel signal and the segment sync signal form (1, −1, −1, 1) of the preset I-channel signal, a second correlation section for obtaining the correlation value between the Q-channel signal outputted from the filtering section and the segment sync signal form (1, −1) of the preset Q-channel signal, an adder for adding the correlation values of the first and second correlation sections, an accumulation section for discriminating a data section and a segment sync section by accumulating outputs of the adder in the unit of one data segment section, and a signal generation section for judging the segment sync section from outputs of the accumulation section, and outputting the control signal for informing the recovery of the segment sync signal.

The timing recovery section comprises a first timing error detection section for operating in accordance with the control signal provided from the segment sync detection section, and extracting the timing error information from the I-channel signal, a second timing error detection section for operating in accordance with the control signal provided from the segment sync detection section, and extracting the timing error information from the Q-channel signal, an adder for adding outputs of the first and second timing error detection sections, a signal conversion section for operating in accordance with the control signal provided form the segment sync detection section, converting an output of the adder into an up/down signal, and outputting the up/down signal to a charging pump, a loop filter for passing therethrough only a low band signal component among the timing error information outputted from the charging pump of the signal conversion section, and a voltage controlled oscillator for recovering the timing by converting its output frequency in accordance with the low band component of the timing error.

In another aspect of the present invention, there is provided a sync signal detecting apparatus for a digital television receiver comprising a first correlation section for obtaining a correlation value between an input I-channel signal and a segment sync signal form of a preset I-channel signal, a filtering section for extracting a Q-channel signal whose phase is inverted by 90° from the I-channel signal, a second correlation section for obtaining a correlation value between the Q-channel signal and a segment sync signal form of a preset Q-channel signal, an accumulation section for adding the correlation values of the first and second correlation sections, and repeating for several data segment sections accumulation of added correlation values in a predetermined unit, and a signal generation section for judging that a position where a peak value is continually detected for the several data segment sections is the segment sync section, and outputting a control signal for informing recovery of the segment sync signal.

In still another aspect of the present invention, there is provided a timing recovering apparatus for a digital television receiver comprising a filtering section for extracting a Q-channel signal whose phase is inverted by 90° from an input I-channel signal, a timing error detection section for operating in accordance with a control signal provided from a segment sync detection section, and extracting timing error information from the I-channel signal and the Q-channel signal, a signal conversion section for operating in accordance with the control signal provided from the segment sync detection section, converting an output of the timing error detection section into an up/down signal, and outputting the up/down signal to a charging pump, a loop filter for passing therethrough only a low band signal component among the timing error information outputted from the charging pump of the signal conversion section, and a voltage controlled oscillator for recovering the timing by converting its output frequency in accordance with the low band component of the timing error.

In still another aspect of the present invention, there is provided a segment sync signal detection and timing recovery method for a digital television receiver comprising the step of (a) extracting a Q-channel signal whose phase is inverted by 90° from an input I-channel signal, (b) obtaining a correlation value between the input I-channel signal and a preset segment sync signal form and a correlation value is between the input Q-channel signal and the preset segment sync signal form, adding and integrating for a predetermined time the two correlation values, judging a segment sync section by searching a peak value of integrated values, and outputting a control signal for informing recovery of the segment sync signal, and © operating in accordance with the control signal provided at step (b), and performing a timing recovery by extracting timing error information from the I-channel signal and the Q-channel signal.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 9a and 9b are views illustrating segment sync patterns having passed through the Hilbert filter in case that a 1-symbol-delayed ghost exists, and a 2-symbol-delayed ghost exists, respectively.

DETAILED DESCRIPTION OF THE PREFERRED EMBODIMENTS

Reference will now be made in detail to the preferred embodiments of the present invention, examples of which are illustrated in the accompanying drawings.

According to the present invention, a Q-component signal is internally produced through a filter in addition to data inputted through an I channel, and the data segment sync signal detection and the timing error detection is performed using the Q-component signal and the data inputted through the I channel.

Figure 6:
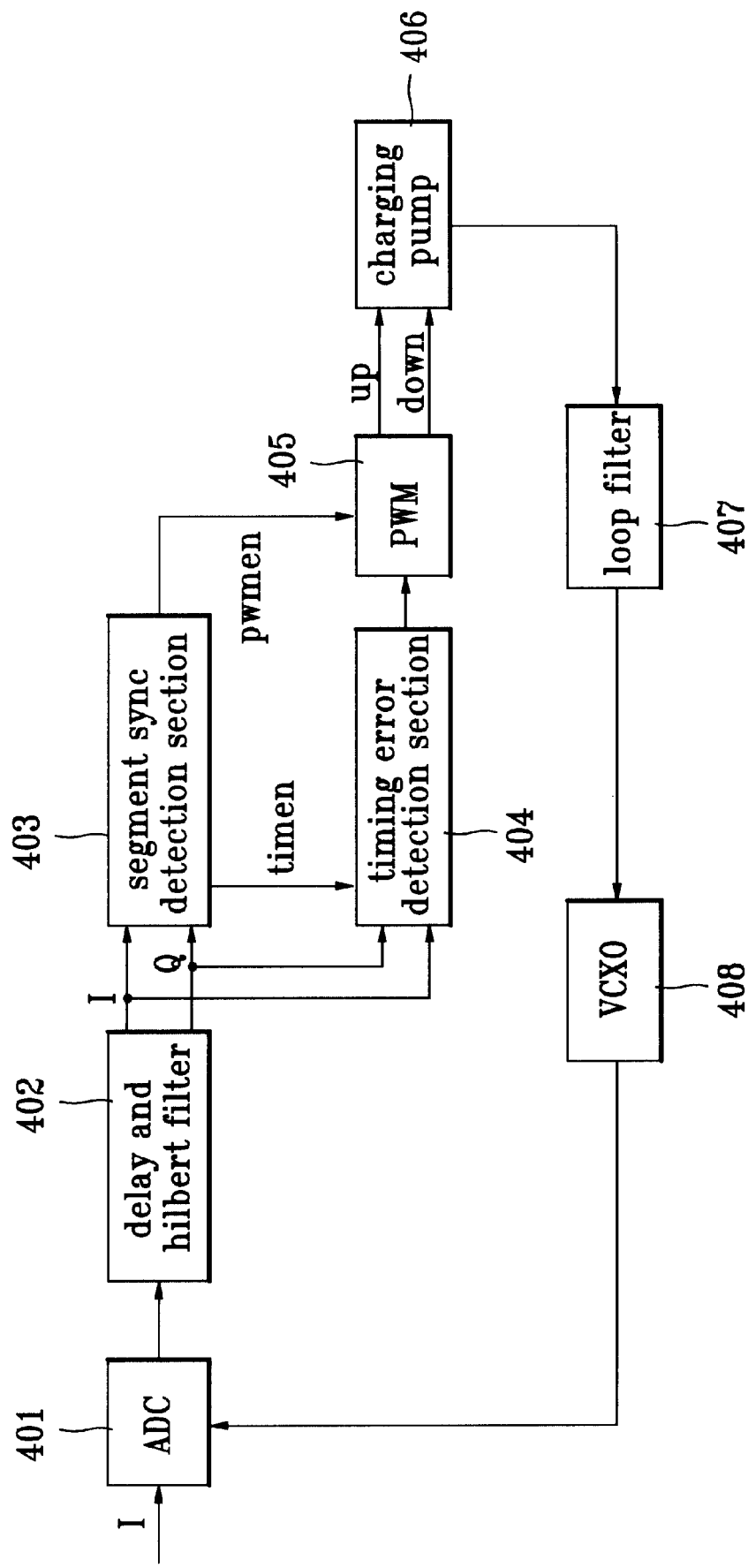
FIG. 6 is a block diagram illustrating the construction of the timing recovery section in a digital TV receiver according to the present invention.

FIG. 6 is a block diagram illustrating the construction of the digital TV receiver according to the present invention, which relates to a timing recovery and a segment sync signal.

Figure 1:
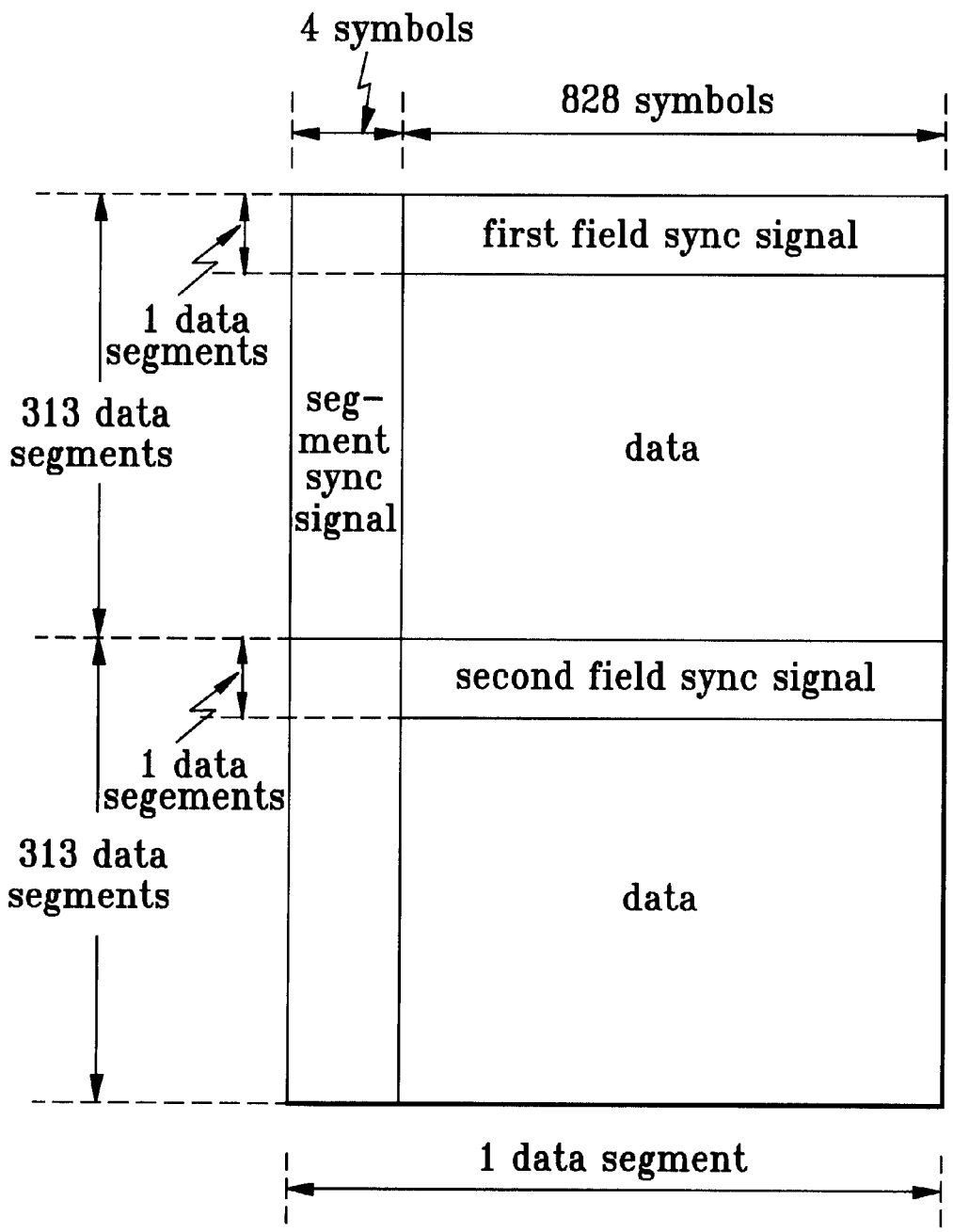
FIG. 1 is a view illustrating a data frame structure of a general digital TV.
Figure 2A:
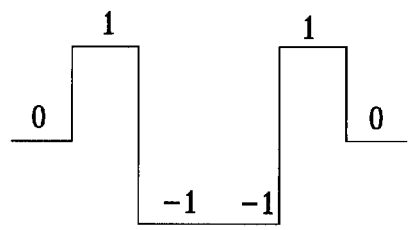
FIGS. 2a and 2b are views illustrating a segment sync pattern, and the segment sync pattern after passing through an LPF.
Figure 2B:
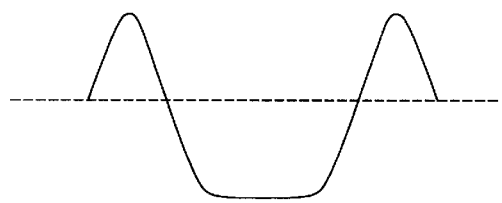
Figure 3:
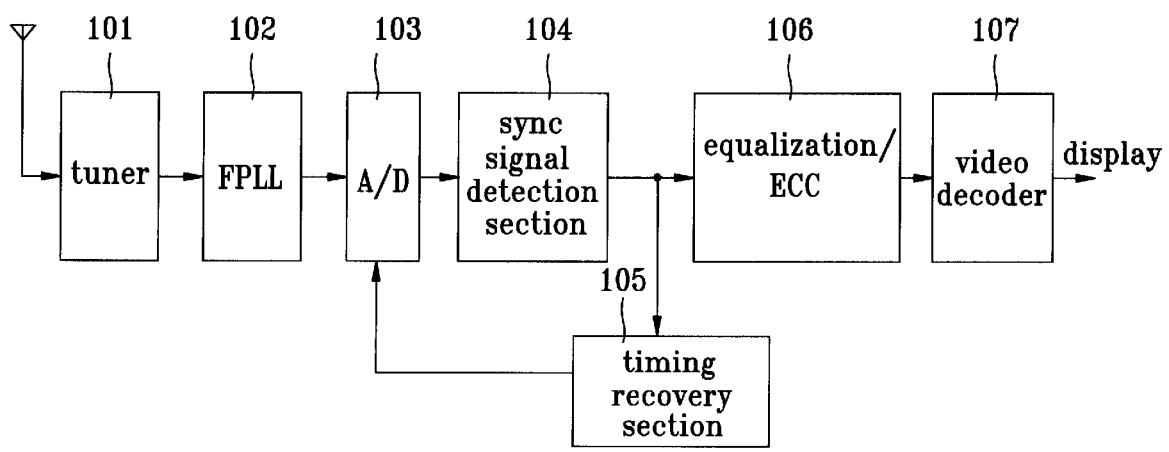
FIG. 3 is a block diagram illustrating the construction of a general digital TV.
Figure 4:
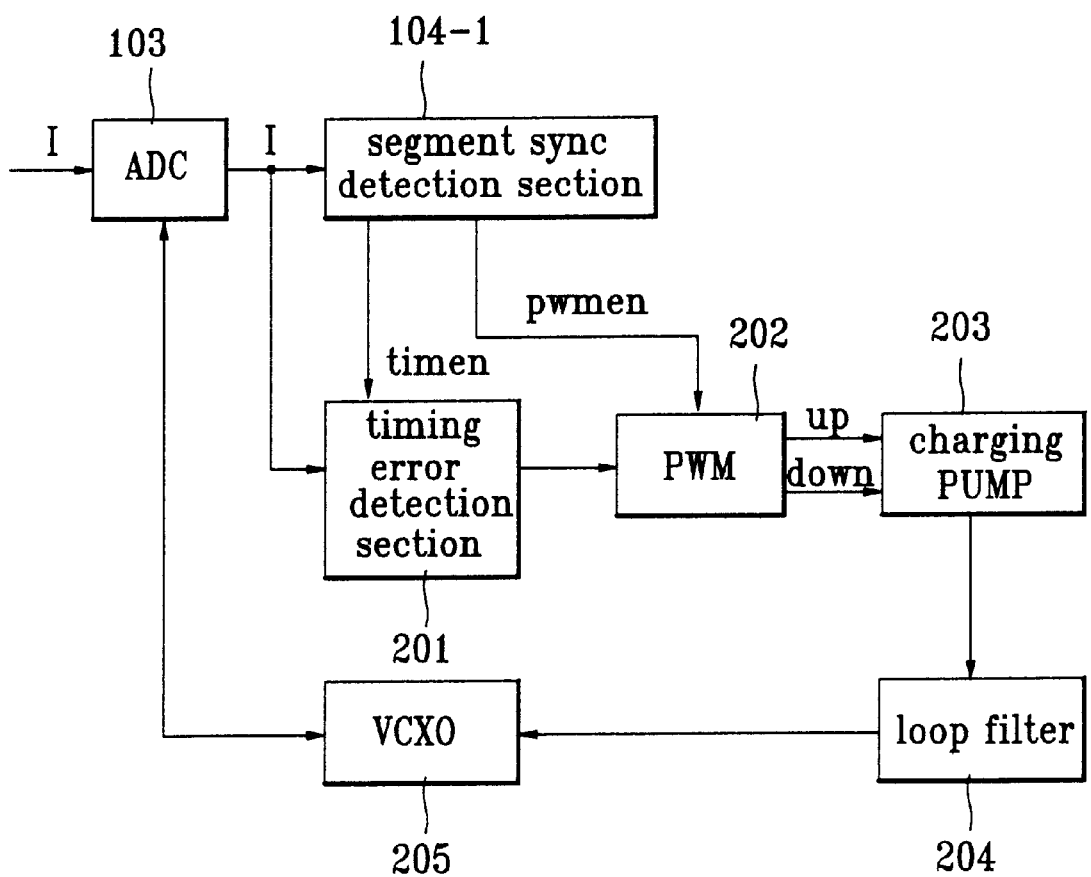
FIG. 4 is a block diagram of the timing recovery section of FIG. 3.
Figure 5:
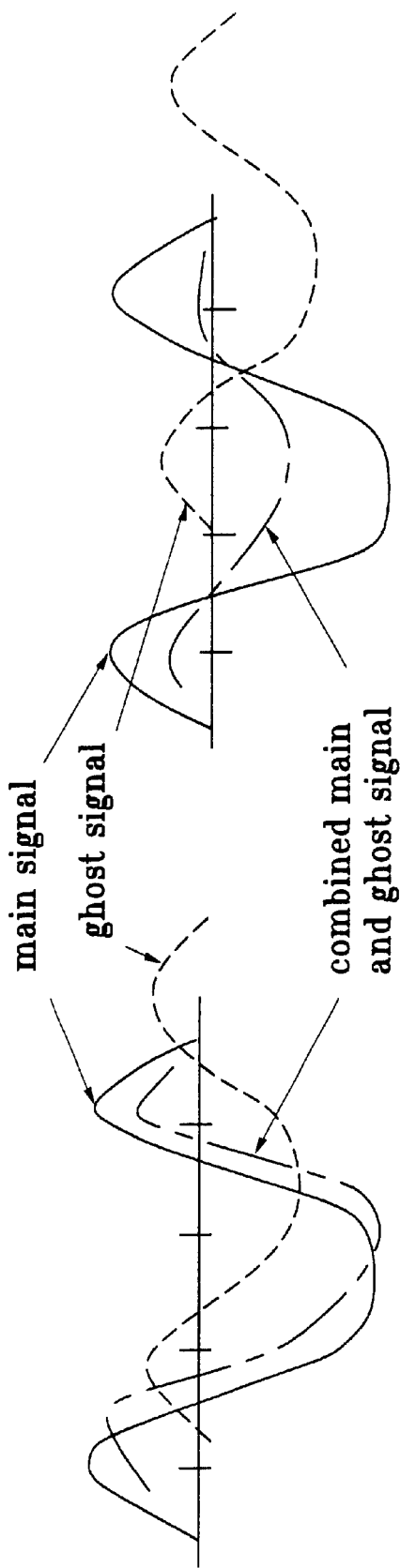
FIGS. 5a and 5b are views illustrating segment sync patterns in case that a 1-symbol-delayed ghost exists, and a 2-symbol-delayed ghost exists, respectively.

Specifically, the digital TV receiver according to the present invention further includes a delay and Hilbert filter 402, connected to the output of the ADC of FIG. 4, for detecting the Q component from the data of the I channel. The segment sync detection section 403 and the timing error detection section 404 recover the segment synchronization and detect the timing error using the output of the delay and Hilbert filter 402. In the same manner as the conventional digital TV receiver, the timing error detection section may be implemented by a quadrature filter.

Figure 7:
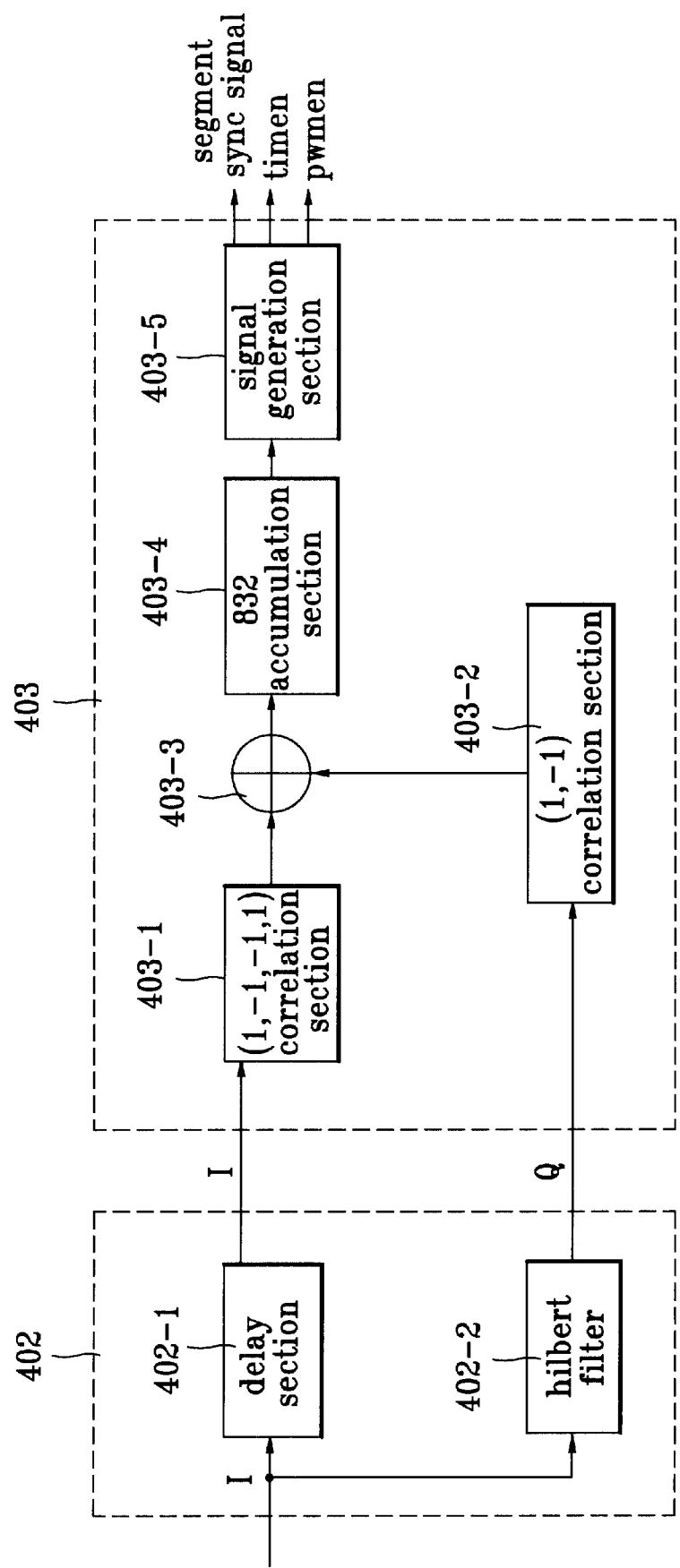
FIG. 7 is a block diagram illustrating the construction of the delay and Hilbert filter, and the segment sync detection section of FIG. 6.

FIG. 7 is a block diagram illustrating the construction of the delay and Hilbert filter 402, and the segment sync detection section 403 of FIG. 6.

The delay and Hilbert filter 402 is composed of a Hilbert filter 402-2 for converting the input I-component signal by 90°, and delay section 402-1 for delaying the input I-component signal for a processing time of the Hilbert filter 402-2.

From the delay and Hilbert filter 402 are outputted a signal passing through the Hilbert filter 402-2, and a signal delayed by the delay section 402-1 for a time corresponding to the number of taps of the Hilbert filter 402-2.

In the present invention, the signal passing through the delay section 402-1 is defined as the I-channel signal, and the signal passing through the Hilbert filter 402-2 is defined as the Q-channel signal for the convenience of explanation.

Here, the Hilbert filter 402-2 is a filter for changing the phase of the input signal by 90°. Accordingly, any filter that performs the Hilbert filtering, i.e., that converts the phase of the input signal by 90°, can be employed instead of the Hilbert filter. In the present invention, the use of the Hilbert filter is exemplified.

The segment sync detection section 403 comprises a first correlation section 403-1 for obtaining a correlation from the I-channel signal outputted from the delay section 402-1, a second correlation section 403-2 for obtaining a correlation from the Q-channel signal outputted from the Hilbert filter 402-2, an adder 403-3 for adding outputs of the first and second correlation sections 403-1 and 403-2, an accumulation section 403-4 for discriminating a data section and a segment sync section by accumulating outputs of the adder 403-3 for a predetermined period, and a signal generation section 403-5 for detecting a segment sync signal from an output of the accumulation section 403-4, and producing enable signals (for example, timen and pwmen signals) from the detected segment sync signal.

Figure 8A:
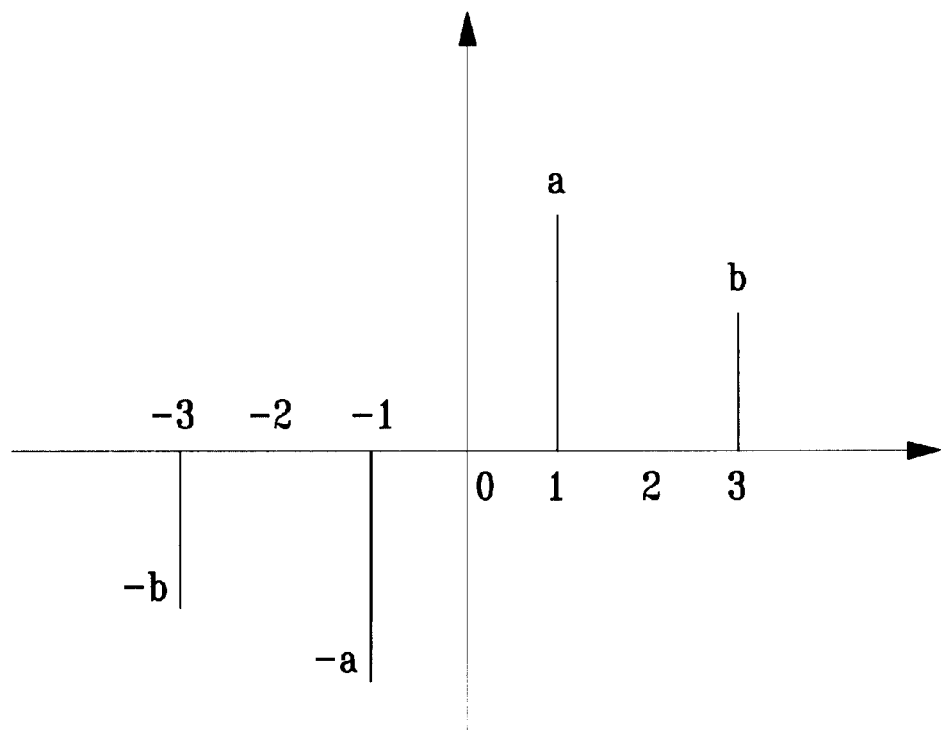
FIGS. 8a and 8b are views illustrating the impulse response characteristic of the Hilbert filter, and the response characteristic of the Hilbert filter to the segment sync pattern.
Figure 8B:
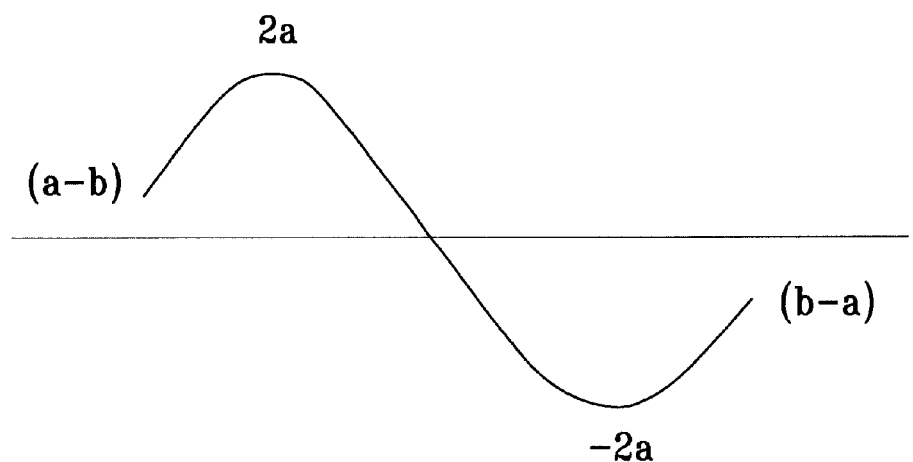

At this time, the impulse response characteristic of the Hilbert filter 402-2 is as shown in FIG. 8a, and the response characteristic to the segment sync pattern (1, −1, −1, 1) is as shown in FIG. 8b. The form of the segment sync pattern (1, −1, −1, 1), after passing through the Hilbert filter 402-2, becomes (a-b, 2a, −2a, b-a). The two symbol values a-b and b-a on both sides of this pattern are affected by the channel environment, but the two symbol values 2a and −2a, i.e., 1 and −1, in the middle thereof show a relatively stable characteristic.

Especially, the segment sync pattern having passed through the Hilbert filter 402-2 shows a strong characteristic against the 2-symbol-delayed ghost, against which the conventional technique shows a very weak characteristic. According to the conventional technique, if a strong 2-symbol-delayed ghost is applied, it is difficult to detect the segment sync pattern from the input data. On the contrary, according to the present invention, even though the strong 2-symbol-delayed ghost is applied, the pattern corresponding to (2a, −2a) can be easily detected, and thus the position of the segment sync signal can be easily detected.

Specifically, since it is prearranged that the 4-symbol segment sync signal inserted in each data segment has the form of (1, 1, −1, 1), the first correlation section 403-1 discriminates whether the I-channel signal outputted from the delay section 402-1 has the form of (1, −1, −1, 1). If the I-channel signal has the form of (1, −1, −1, 1), the first correlation section 403-1 outputs '2', and if not, the first correlation section 403-1 outputs '−1'. At this time, since the 4-symbol segment sync signal is inserted in every 832 symbols, there is a greatest probability that the first correlation section 403-1 outputs '−1'.

Meanwhile, the second correlation section 403-2 discriminates whether the Q-channel signal outputted from the Hilbert filter 402-2 has the form of (1, −1). If the Q-channel signal has the form of (1, 1), the second correlation section 403-2 outputs '2', and if not, the second correlation section 403-2 outputs '−1'. Here, the constants '2' and '−1' are taken as an example, and they may be changed by a designer.

The adder 403-3 adds the outputs of the first and second correlation sections 403-1 and 403-2, and outputs the added value to the accumulation section 403-4.

At this time, if the correlation appears on both paths, i.e., both the first and second correlation sections 403-1 and 403-2 output '2', the output of the adder 403-3 becomes '4'. If the correlation appears on either of the two paths, the adder 403-3 outputs '1', and if the correlation appears on neither of the two paths, the adder 403-3 outputs '−2'.

The accumulation section 403-4 discriminates the data section and segment sync section by continuously adding the input signals for a period of 832 symbols. Specifically, if a noise is mixed with the transmitted signal as the transmitted signal passes through the channel, it cannot have the form of the segment sync signal. Accordingly, the position of the segment sync signal can be detected only by integrating the values of various data segments.

If the integrating process is repeatedly performed for various data segments, the integrated value becomes larger in the section of the segment sync signal, and the integrated value becomes smaller in the general data section. Specifically, since there is every probability that the data outputted from the first and second correlation sections 403-1 and 403-2 becomes '−1' in the data section, the integrated value is decreased by the repeated integration. Meanwhile, since there is every probability that the data becomes '2' in the sync section, the integrated value is increased by the repeated integration.

Accordingly, the signal generation section 403-5 detects the position where the peak value exists for every segment. At this time, if the peak value is continuously detected at the same position for several data segments, the signal generation section 403-5 judges the position to be the segment sync section, and outputs the signal informing the segment sync section.

Also, the signal generation section 403-5 generates the enable signal timen of the timing error detection section 404 for extracting the timing information, and the enable signal pwmen of the PWM section 405 for converting the output of the timing error detection section 404 so that the converted signal can be used in the charging pump 406.

FIGS. 9a and 9b show the output characteristics of the Hilbert filter 402-2 in case that a 1-symbol-delayed ghost exists, and a 2-symbol-delayed ghost exists, respectively.

As shown in FIGS. 9a and 9b, the pattern is not maintained to some extent when the 1-symbol-delayed ghost is applied, but the pattern is maintained well when the 2-symbol-delayed ghost is applied.

Accordingly, according to the present invention, the segment sync signal can be easily and accurately detected against the strong 2-symbol-delayed ghost using the above-described characteristic of the data having passed through the Hilbert filter 402-2.

At this time, though a bad characteristic appears against the 1-symbol-delayed ghost, the segment sync section can be detected by the correlation value obtained from the I channel.

As described above, the time required for searching the segment sync section having the maximum value through the accumulation section 403-4 is reduced in comparison to the conventional method, and thus the acquisition and tracking time for the timing recovery can be reduced.

Figure 10A:
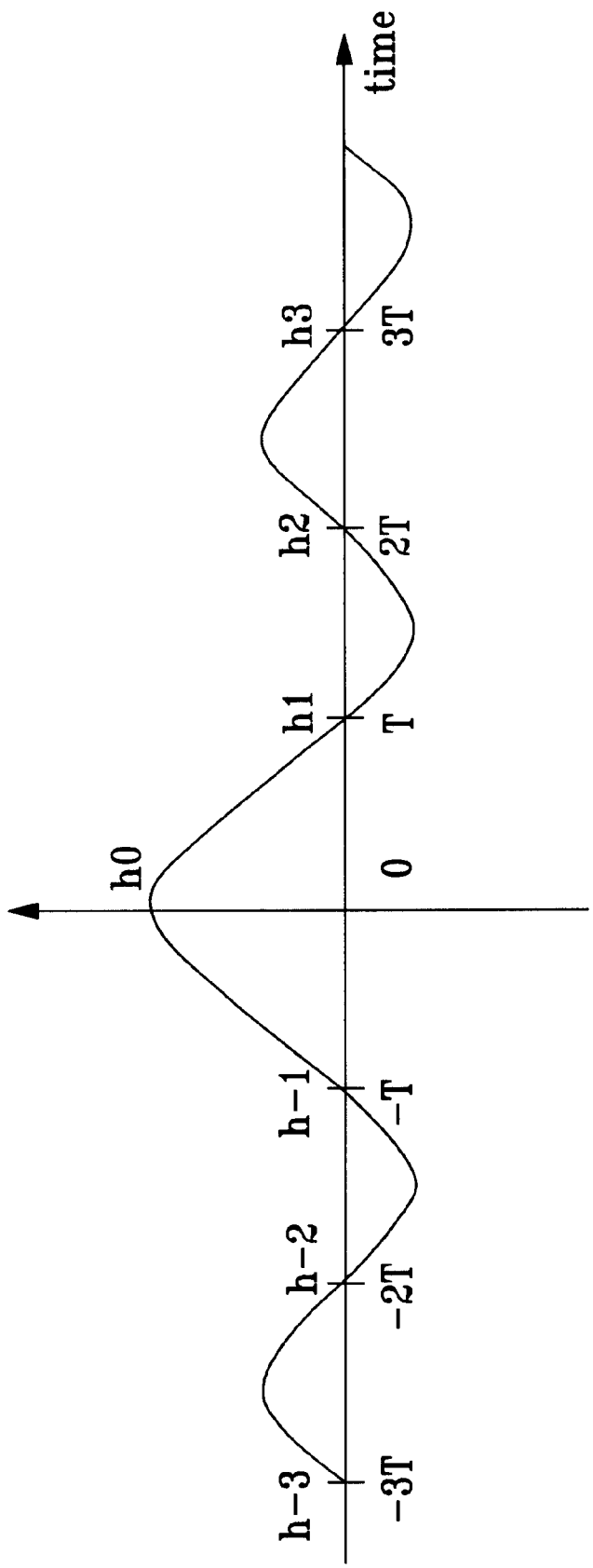
FIGS. 10a and 10b are graphs showing the relationship between I-channel input data and (1, −1, −1, 1) sync pattern.
Figure 10B:
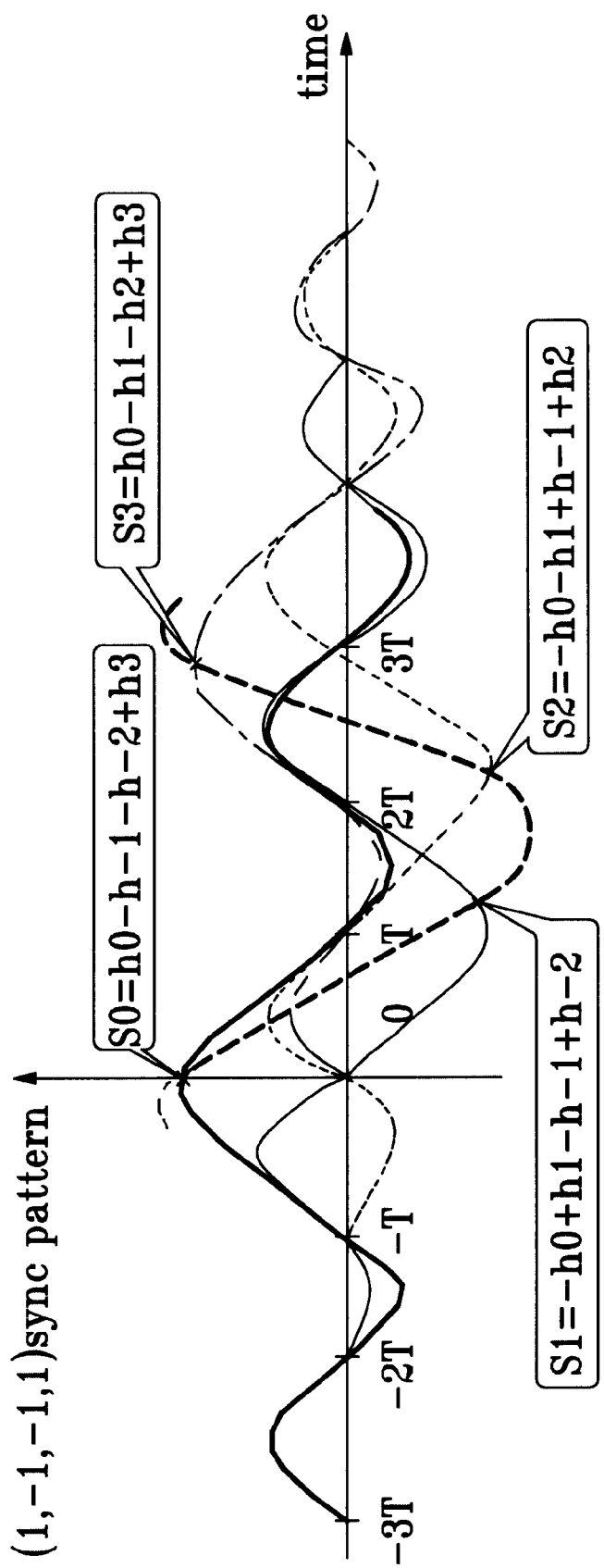

Meanwhile, the Q-channel signal outputted from the Hilbert filter 402-2 is also used in the timing error detection section 404 for detecting the timing error. Specifically, in the I-channel input data of FIG. 10a, the (1, −1, −1, 1) segment sync pattern is as shown in FIG. 10b. At this time, the timing error e is detected by the following equation.

[Equation 1]

$$e = (S0+S1) - (S2+S3)$$

$$= 3(h1 - h - 1) - (h3 - h - 3)$$

Figure 12:
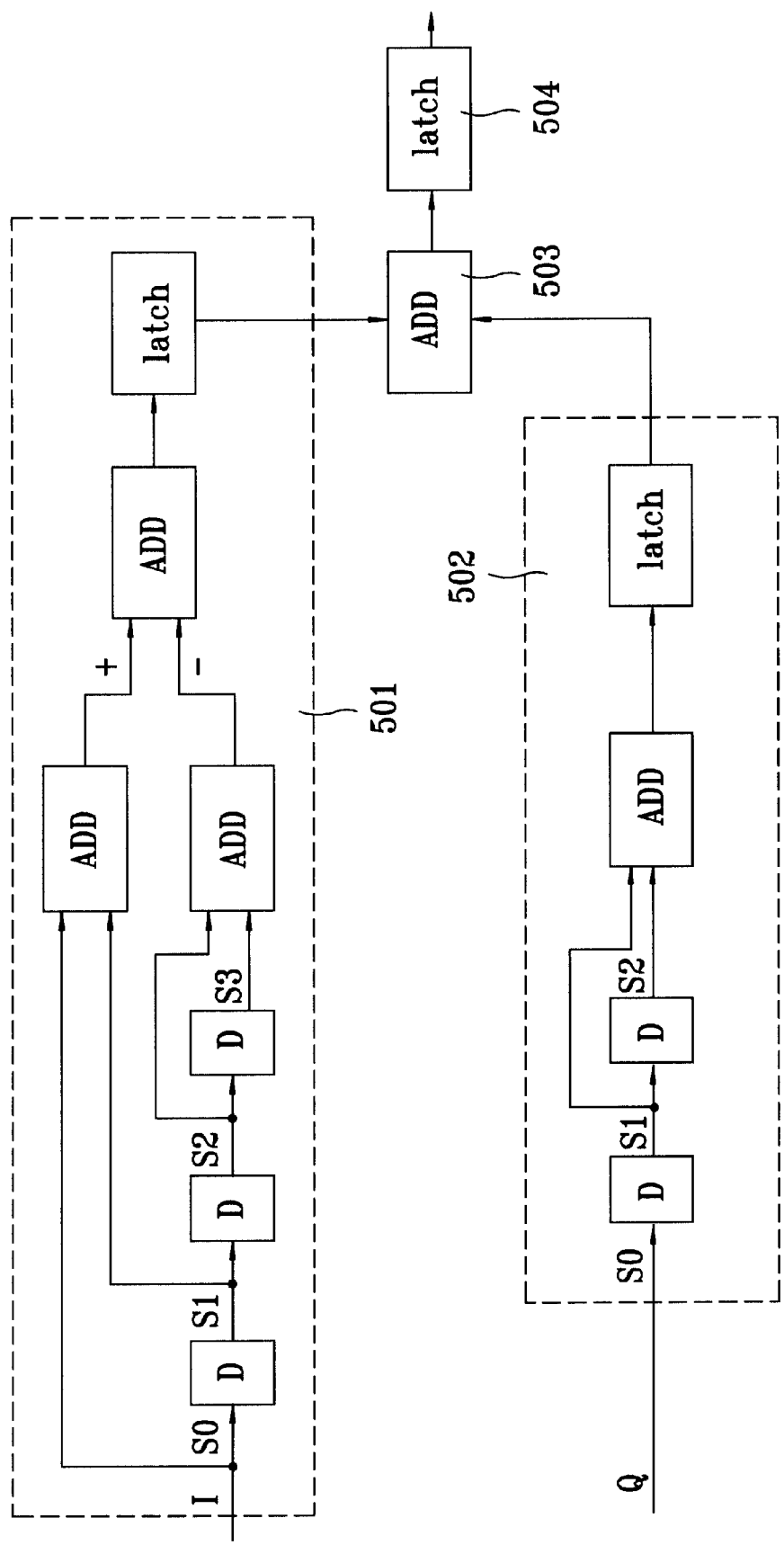
FIG. 12 is a block diagram illustrating the construction of the quadrature filter of FIG. 6.

Here, $S0 = h0 - h - 1 - h - 2 + h3$, $S1 = -h0 + h1 - h - 1 + h - 2$, $S2 = -h0 - h1 + h - 1 + h2$, and $S3 = h0 - h1 - h2 + h3$. This can be implemented by the first timing error detection section 501 of the quadrature filter of FIG. 12, and can be presented as an S-curve of FIG. 13.

The first timing error detection section 501 comprises first to third delays for sequentially delaying the input I-channel signal, a first adder for adding the input I-channel signal S0 and an output S1 of the first delay, a second adder for adding outputs S2 and S3 of the second and third delays, and a subtracter for obtaining and outputting a difference signal ((S0+S1)−(S2+S3)) of the first and second adders.

Figure 11A:
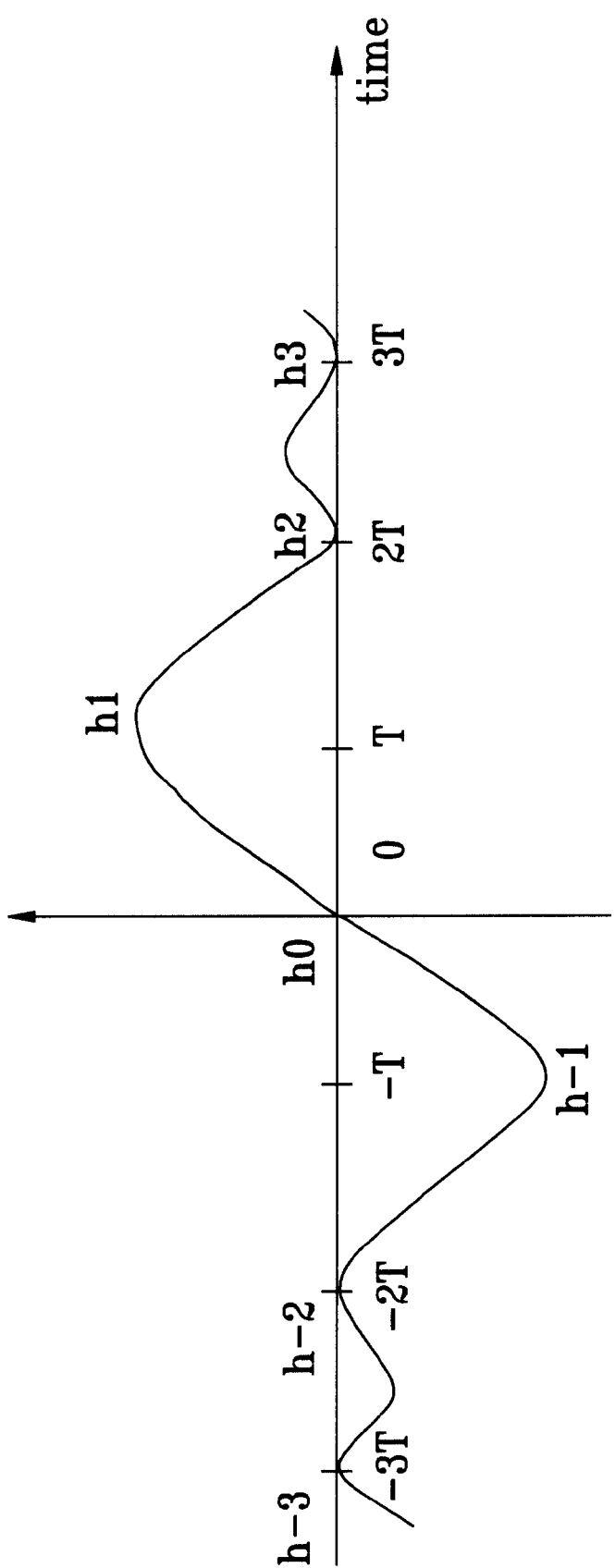
FIGS. 11a and 11b are graphs showing the relationship between Q-channel input data and (1, −1, −1, 1) sync pattern.
Figure 11B:
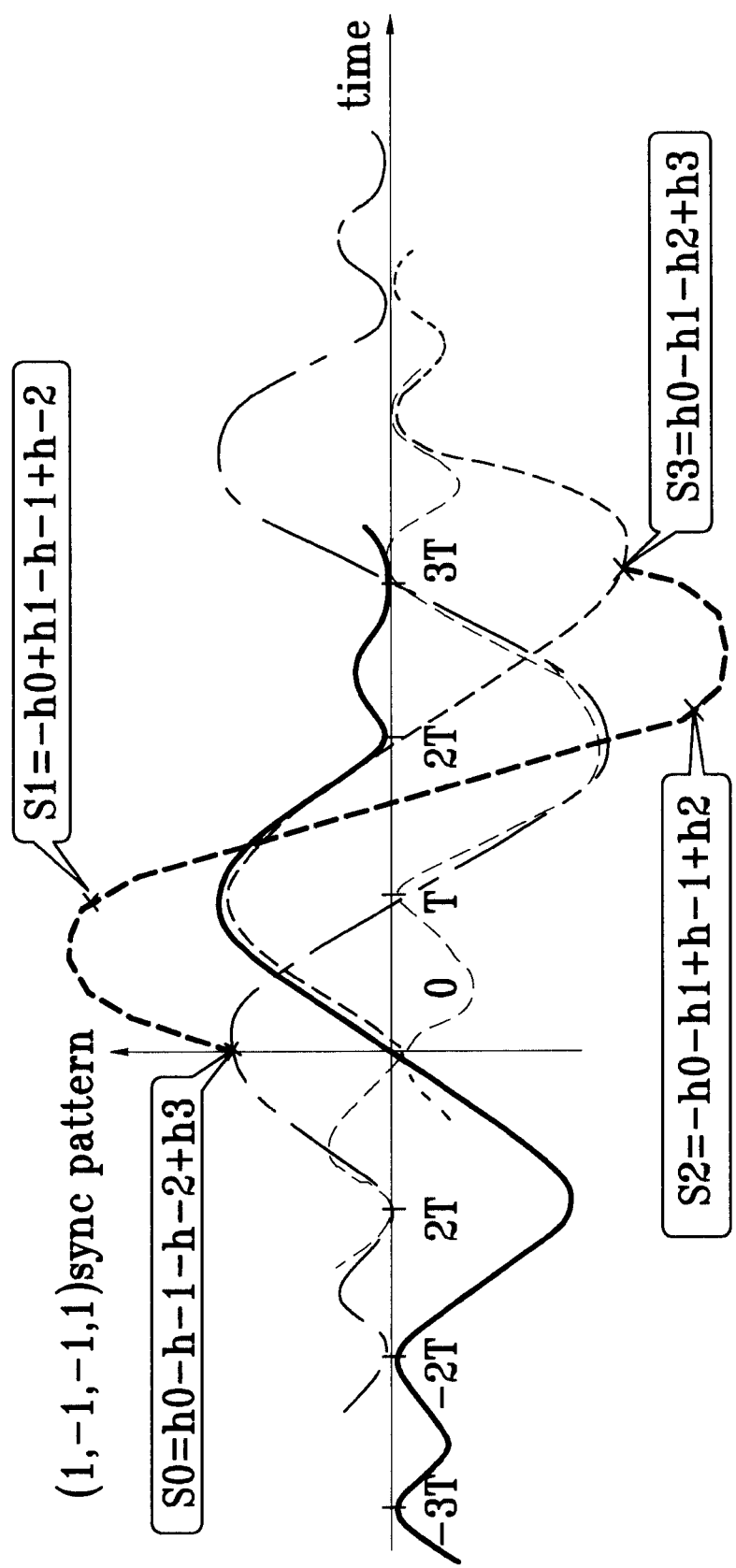

Also, in the Q-channel input data of FIG. 11a, the (1, −1, −1, 1) segment sync pattern is as shown in FIG. 11b. At this time, the timing error e is detected by the following equation.

[Equation 2]

$$e = S1 + S2$$
$$= -2h0 + (h2 + h - 2)$$

Here, $S1 = -h0 + h1 - h - 1 + h - 2$, and $S2 = -h0 - h1 + h - 1 + h2$. This can be implemented by the second timing error detection section 502 of the quadrature filter of FIG. 12, and can be presented as an S-curve of FIG. 13.

The second timing error detection section 502 comprises fourth and fifth delays for sequentially delaying the input Q-channel signal, and a third adder for adding outputs S1 and S2 of the fourth and fifth delays.

At this time, the adder 503 adds the timing errors detected by the first and second timing error detection sections 501 and 502, and outputs an added timing error through a latch 504 as the final timing error value.

Here, the S-curve is for obtaining an average value of the timing error, and is expressed by a function of timing offset (error) given by the following equation.

[Equation 3] $S(_?) = E\{e(k)|_?\}$

Here, E{} denotes a statistical average of the symbol data.

Figure 13:
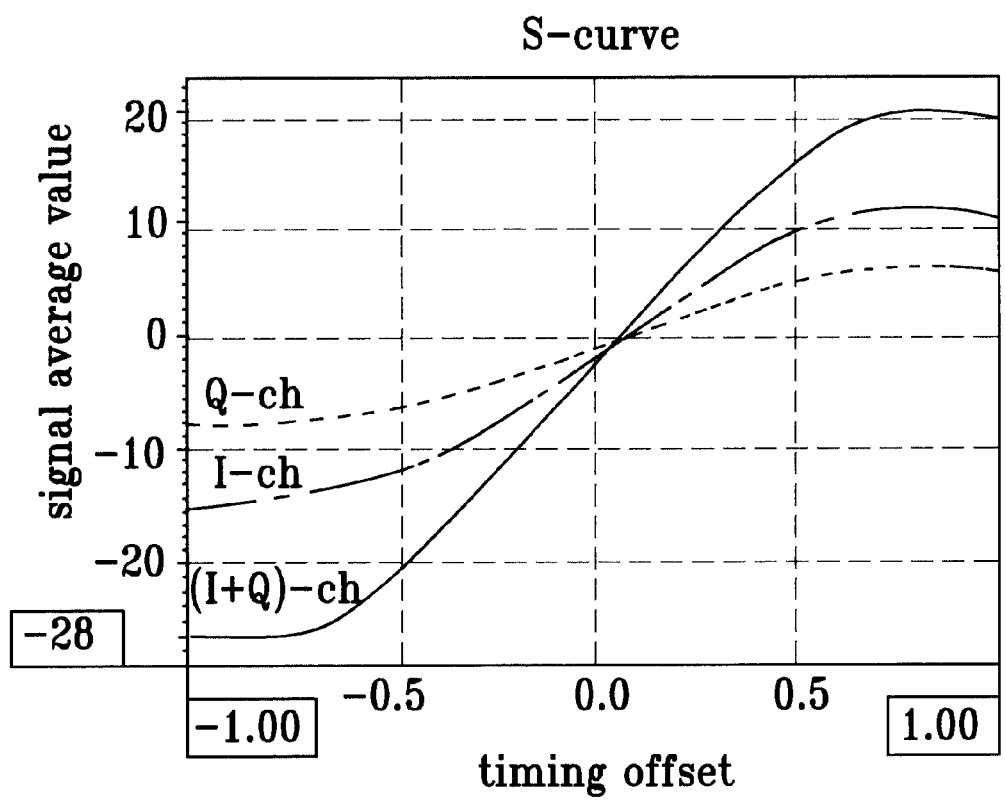
FIG. 13 is a graph showing respective S-curve characteristics of the quadrature filter of FIG. 12.

Specifically, the performance of the timing recovery can be known by the S curve. As the slope of the S curve becomes bigger, the characteristic of timing recovery becomes better. For example, the tracking performance for the timing error and the zitter performance become improved. As shown in FIG. 13, the timing error information can be obtained even in the Q channel through the S-curve characteristic. Also, '(I+Q)−ch' in FIG. 13 indicates the S-curve characteristic that corresponds to the output of the adder 503 for adding the timing errors detected by the first and second timing error detection sections 501 and 502, and its slope is the biggest among the three S-curve characteristics. Accordingly, it can be recognized that the timing recovery function proposed by the present invention is superior in comparison to the conventional technique.

Meanwhile, the segment sync signal detected according to the present invention can be applied not only to the timing recovery but also to all the fields that require the segment sync signal.

As described above, according to the timing recovering apparatus and method for a digital TV according to the present invention, the timing error can be compensated for by rapidly and accurately searching the position of the segment sync signal using the Hilbert filter even if the strong 2-symbol-delayed ghost is applied. Also, the tracking performance for the timing error and the zitter performance can be improved by extracting the timing error information even from the signal having passed through the Hilbert filter. Accordingly, the whole performance of the DTV receiver can be improved. Also, even in case that a strong ghost is applied through an indoor antenna, the viewing of the DTV is possible.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. A digital television (TV) receiver for recovering received data by producing the same segment sync signal and clock as those inserted when the data is transmitted using an input I-channel signal, the digital TV receiver comprising:

a filtering section for extracting a Q-channel signal whose phase is inverted by 90° from the input I-channel signal;

a segment sync detection section for obtaining a correlation value between the input I-channel signal and a preset segment sync signal form and a correlation value between the input Q-channel signal and the preset segment sync signal form, and adding and integrating for a predetermined time the two correlation values, the segment sync detection section judging a segment sync section by searching a peak value of integrated values, and outputting a control signal for informing recovery of the segment sync signal; and a timing recovery section for operating in accordance with the control signal provided from the segment sync detection section, and performing a timing recovery by extracting timing error information from the I-channel signal and the Q-channel signal.

2. The digital TV receiver as claimed in claim 1, wherein the filtering section comprises a Hilbert filter for inverting a phase of the input I-channel signal by 90°.

3. The digital TV receiver as claimed in claim 2, wherein the filtering section further comprises a delay section for delaying the input I-channel signal for a processing time of the Hilbert filter, and outputting the delayed I-channel signal to the segment sync detection section and the timing recovery section.

4. The digital TV receiver as claimed in claim 1, wherein the segment sync detection section comprises:

a first correlation section for obtaining the correlation value between the input I-channel signal and the segment sync signal form (1, −1, −1, 1) of the preset I-channel signal;

a second correlation section for obtaining the correlation value between the Q-channel signal outputted from the filtering section and the segment sync signal form (1, −1) of the preset Q-channel signal;

an adder for adding the correlation values of the first and second correlation sections;

an accumulation section for discriminating a data section and a segment sync section by accumulating outputs of the adder in the unit of one data segment section; and a signal generation section for judging the segment sync section from outputs of the accumulation section, and outputting the control signal for informing the recovery of the segment sync signal.

5. The digital TV receiver as claimed in claim 4, wherein if a peak value is continually detected at the same position for several segment sections, the signal generation section judges the position as the segment sync section.

6. The digital TV receiver as claimed in claim 4, wherein if the input I-channel signal shows the segment sync signal form of the preset I-channel signal, the first correlation section outputs a plus constant, and otherwise, it outputs a minus constant.

7. The digital TV receiver as claimed in claim 6, wherein the plus constant is +2, and the minus constant is −1.

8. The digital TV receiver as claimed in claim 4, wherein if the input Q-channel signal shows the segment sync signal form of the preset Q-channel signal, the second correlation section outputs a plus constant, and otherwise, it outputs a minus constant.

9. The digital TV receiver as claimed in claim 1, wherein the timing recovery section comprises:
   a first timing error detection section for operating in accordance with the control signal provided from the segment sync detection section, and extracting the timing error information from the I-channel signal;
   a second timing error detection section for operating in accordance with the control signal provided from the segment sync detection section, and extracting the timing error information from the Q-channel signal;
   an adder for adding outputs of the first and second timing error detection sections;
   a signal conversion section for operating in accordance with the control signal provided form the segment sync detection section, converting an output of the adder into an up/down signal, and outputting the up/down signal to a charging pump;
   a loop filter for passing therethrough only a low band signal component among the timing error information outputted from the charging pump of the signal conversion section; and
   a voltage controlled oscillator for recovering the timing by converting its output frequency in accordance with the low band component of the timing error.

10. A sync signal detecting apparatus for a digital television (TV) receiver for detecting a segment sync signal inserted at a transmission part from an input I-channel signal, the apparatus comprising:
    a first correlation section for obtaining a correlation value between the input I-channel signal and the segment sync signal form (1, −1, −1, 1) of a preset I-channel signal;
    a filtering section for extracting a Q-channel signal whose phase is inverted by 90° from the I-channel signal;
    a second correlation section for obtaining a correlation value between the Q-channel signal and a segment sync signal form (1, −1) of a preset Q-channel signal;
    an accumulation section for adding the correlation values of the first and second correlation sections, and repeating for several data segment sections accumulation of added correlation values in a predetermined unit; and
    a signal generation section for judging that a position where a peak value is continually detected for the several data segment sections is the segment sync section, and outputting a control signal for informing recovery of the segment sync signal.

11. The apparatus as claimed in claim 10, wherein the filtering section comprises:
    a Hilbert filter for inverting a phase of the input I-component signal by 90°, and outputting the phase-inverted I-component signal to the second correlation section; and
    a delay section for delaying the input I-component signal for a processing time of the Hilbert filter, and outputting the delayed I-component signal to the first correlation section.

12. The apparatus as claimed in claim 10, wherein the predetermined unit in the accumulation section is one data segment section.

13. A timing recovering apparatus for a digital television (TV) receiver for recovering received data by producing the same clock as that inserted when the data is transmitted for a segment sync section detected by a segment sync detection section, the apparatus comprising:
    a filtering section for extracting a Q-channel signal whose phase is inverted by 90° from an input I-channel signal;
    a timing error detection section for operating in accordance with a control signal provided from the segment sync detection section, and extracting timing error information from the I-channel signal and the Q-channel signal;
    a signal conversion section for operating in accordance with the control signal provided from the segment sync detection section, converting an output of the timing error detection section into an up/down signal, and outputting the up/down signal to a charging pump;
    a loop filter for passing therethrough only a low band signal component among the timing error information outputted from the charging pump of the signal conversion section; and
    a voltage controlled oscillator for recovering the timing by converting its output frequency in accordance with the low band component of the timing error.

14. The apparatus as claimed in claim 13, wherein the timing error detection section comprises:
    a first timing error detection section for operating in accordance with the control signal provided from the segment sync detection section, and extracting the timing error information from the I-channel signal;
    a second timing error detection section for operating in accordance with the control signal provided from the segment sync detection section, and extracting the timing error information from the Q-channel signal; and
    an adder for adding outputs of the first and second timing error detection sections.

15. The apparatus as claimed in claim 13, wherein the filtering section comprises:
    a Hilbert filter for inverting a phase of the input I-channel signal by 90°, and outputting the phase-inverted I-channel signal to the second timing error detection section; and
    a delay section for delaying the input I-channel signal for a processing time of the Hilbert filter, and outputting the delayed I-channel signal to the first timing error detection section.

16. The apparatus as claimed in claim 14, wherein the first timing error detection section comprises:
    first to third delays for sequentially delaying the input I-channel signal for a predetermined time;
    a first adder for adding the input I-channel signal and an output of the first delay;
    a second adder for adding outputs of the second and third delays; and
    a subtracter for obtaining and temporarily latching a difference signal of the first and second adders.

17. The apparatus as claimed in claim 14, wherein the second timing error detection section comprises:
    fourth and fifth delays for sequentially delaying the input Q-channel signal for a predetermined time; and a third adder for adding and temporarily latching outputs of the fourth and fifth delays.

18. A segment sync signal detection and timing recovery method for a digital television (TV) receiver for recovering received data by producing the same segment sync signal and clock as those inserted when the data is transmitted using an input I-channel signal, the method comprising the step of:

(a) extracting a Q-channel signal whose phase is inverted by 90° from the input I-channel signal;

(b) obtaining a correlation value between the input I-channel signal and a segment sync signal form of a preset I-channel signal and a correlation value between the input Q-channel signal and the segment sync signal form of a preset Q-channel signal, adding and integrating for a predetermined time the two correlation values, judging a segment sync section by searching a peak value of integrated values, and outputting a control signal for informing recovery of the segment sync signal; and (c) operating in accordance with the control signal provided at step (b), and performing a timing recovery by extracting timing error information from the I-channel signal and the Q-channel signal.

19. The method as claimed in claim 18, wherein the step (b) comprises the steps of:

obtaining a first correlation value between the input I-channel signal and the segment sync signal form (1, −1, −1, 1) of the preset I-channel signal;

obtaining a second correlation value between the input Q-channel signal and the segment sync signal form (1, −1) of the preset Q-channel signal;

adding the first and second correlation values;

repeating an accumulation process of accumulating in the unit of one data segment section a result of addition at the adding step for several data segment sections; and if a peak value is continually detected at the same position for the several segment sections, judging the position as the segment sync section, and outputting the control signal for informing the recovery of the segment sync signal.

20. The method as claimed in claim 18, wherein the step (c) comprises the steps of:

operating in accordance with the control signal provided if the segment sync signal is detected at step (b), and extracting a first timing error information form the I-channel signal;

operating in accordance with the control signal provided if the segment sync signal is detected at step (b), and extracting a second timing error information from the Q-channel signal;

adding the first timing error information and the second timing error information;

operating in accordance with the control signal provided if the segment sync signal is detected at step (b), converting a result of addition at the adding step into an up/down signal, and outputting the up/down signal to a charging pump;

passing only a low band signal component among the timing error information outputted from the charging pump; and recovering the timing by converting an output frequency in accordance with the low band component of the timing error.

* * * * *